(12) United States Patent
Gousev et al.

(10) Patent No.: US 6,287,897 B1
(45) Date of Patent: Sep. 11, 2001

(54) GATE DIELECTRIC WITH SELF FORMING DIFFUSION BARRIER

(75) Inventors: Evgeni Gousev, Mahopac; Kai Chen, Hopewell Junction; Asit Kumar Ray, Yorktown Heights, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/515,109

(22) Filed: Feb. 29, 2000

(51) Int. Cl.[7] ............... H01L 21/335; H01L 21/8232
(52) U.S. Cl. .................... 438/142; 438/585; 438/624
(58) Field of Search .................... 438/142, 585, 438/624, 639, 659, 775, 791, 299, 300, 301, 592, 649, 676, 682

(56) References Cited

U.S. PATENT DOCUMENTS

| | | | |
|---|---|---|---|
| 4,411,929 | 10/1983 | Sato et al. | 427/38 |
| 4,510,172 | * 4/1985 | Ray | 427/38 |
| 4,683,637 | * 8/1987 | Varker et al. | 438/294 |
| 4,891,684 | * 1/1990 | Nishioka et al. | 357/51 |
| 5,229,310 | * 7/1993 | Sivan | 438/156 |
| 5,783,469 | * 7/1998 | Gardner et al. | 438/199 |
| 5,783,798 | * 7/1998 | Abraham | 219/121.73 |
| 5,891,798 | 4/1999 | Doyle et al. | 438/624 |
| 5,981,798 | * 4/1999 | Doyle et al. | 438/624 |
| 6,180,469 | * 1/2001 | Pramanick et al. | 438/299 |

* cited by examiner

*Primary Examiner*—David Nelms
*Assistant Examiner*—Phuc T. Dang
(74) *Attorney, Agent, or Firm*—Jay A. Anderson; Cantor Colburn LLP

(57) ABSTRACT

A method for forming a semiconductor device comprising forming a dielectric layer on an area of a silicon substrate; implanting nitrogen atoms into said dielectric layer; forming a conductive layer of polysilicon over said dielectric layer; annealing the dielectric layer to drive the nitrogen atoms to form a gate dielectric of a dielectric layer having silicon nitride layer interfaces of the dielectric layer and the silicon substrate and the polysilicon layers; and, forming a gate structure in said polysilicon layer and source/drain regions in said silicon substrate, said source/drain regions aligned with said gate structure.

19 Claims, 3 Drawing Sheets

GATE DIELECTRIC WITH SELF FORMING DIFFUSION BARRIER

BACKGROUND OF THE INVENTION

The present invention relates to a gate dielectric for a CMOS device that is thermally stable and resistant to dopant diffusion, and a method of fabricating a CMOS device employing such a gate dielectric.

In complementary metal oxide silicon (CMOS) technology, a need to enhance the speed and increase the density of CMOS integrated circuits (IC's) has resulted in the evolution of transistor scaling, accompanied by progressively thinner gate dielectric oxide. Reduction in the thickness of a gate dielectric provides increased drive current, with resultant increased speed. In addition, a thinner gate dielectric offers enhanced control of channel charge, thereby reducing short channel effects. However, the fabrication of thinner gate oxides presents gate leakage current and reliability issues. In particular, physically thinner gate oxides exhibit gate leakage increasing exponentially with reduction in thickness.

The most common gate dielectric material in CMOS devices has been silicon oxide ($SiO_2$) or $SiO_2$/silicon nitride ($Si_3N_4$) or oxynitride ($SiO_xN_y$) combinations. In the case of combinations, the $Si_3N_4$ or $SiO_xN_y$ often is employed as a diffusion barrier layer. As the thickness of the $SiO_2$ and $Si_3N_4$ films is reduced and approaches the 20 Å regime, substantial problems begin to appear. These problems include the production of incomplete films leading to leaky gates and low breakdown, charge trapping at the gate channel interface as well as in the bulk silicon, and difficulty of manufacture and thickness control.

One solution to the problems of thinner gate dielectrics is to use thick dielectric films having high dielectric constants (high K). In this manner, the actual physical thickness of the gate dielectric film can be large, while the electrical equivalent thickness relative to the $SiO_2$ or $SiO_2$/$Si_3N_4$ films can be scaled. The equivalent thickness ("teq") of a high dielectric constant material to $SiO_2$, for example, may be calculated by the formula:

$$teq = tphy\,(SiO_2/\text{high K})$$

where "tphy" is the actual thickness of the substitute high dielectric constant material film, $SiO_2$ is the dielectric constant of $SiO_2$ (K=3.8), and high K is the dielectric constant of the substitute high dielectric constant film.

Any practicable gate dielectric film structure must meet at least two vital criteria. Firstly, the dielectric must be thermally stable with respect to the silicon substrate, and, secondly, it must be able to serve as a dopant barrier. Dopant barrier capability, particularly to boron, is essential if the gate dielectric is to be useful in a CMOS structure, since boron is used to dope polysilicon gates in p-channel field effect transistors ("PFETs"). A dielectric film structure having a high dielectric constant (or a small teq relative to $SiO_2$) and an effective method of fabrication thereof is needed for development of improved performance CMOS devices.

SUMMARY OF THE INVENTION

Now, according to the present invention, a high K gate dielectric material is provided which, during fabrication, forms a dopant barrier layer. The present invention utilizes a high K dielectric material as the primary gate dielectric. Suitable high K dielectric materials are metallic oxide or metallic silicate materials. Such materials may be selected from the group consisting of $Ta_2O_5$, $Al_2O_3$, $TiO_2$, $ZrO_2$, $Y_2O_3$, $La_2O_3$, and $HfO_2$, or silicates of Ta, Al, Ti, Zr, Y, La, and Hf, and the like. Preferably, the high K material comprises Zr or Al oxides or silicates. The dielectric material preferably is deposited on a silicon substrate and then forms a silicon nitride dopant diffusion barrier layer by implantation of nitrogen during fabrication of an electronic device. Preferably, an upper dopant diffusion barrier layer and a lower dopant diffusion barrier are formed on the top and bottom surfaces of the metallic oxide dielectric layer. Preferably, the top and bottom diffusion barriers comprise about 5 Å to about 10 Å layers of oxy nitride film. The resultant gate dielectric layer preferably has an equivalent oxide thickness (EOT) of less than about 20 Å $SiO_2$. Utilizing $Ta_2O_5$ as the high dielectric material requires about a 40 Å layer to accomplish the desired 20 Å $SiO_2$ EOT. Other preferred thermodynamically stable, high dielectric materials such as $TiO_2$ (K=40) and $Al_2O_3$ (K=12) would require about 60 Å and 100 Å thick dielectric layers respectively.

BRIEF DESCRIPTION OF THE DRAWINGS

For further understanding of the present invention, reference should be made to the following detailed description of the preferred embodiments taken in conjunction with the accompanying drawings in which like elements have been designated with like reference numerals, and wherein.

DETAILED DESCRIPTION OF THE INVENTION

Figure 1:
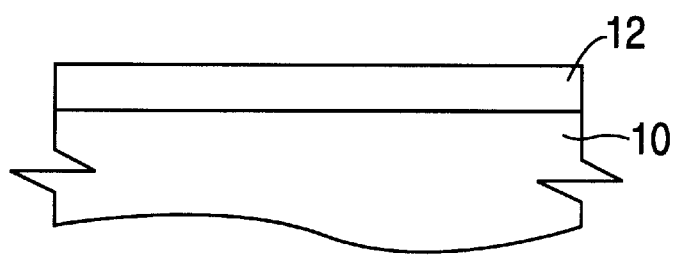
FIG. 1 is a cross-sectional illustration of a portion of substrate on which a dielectric layer has been deposited.
Figure 6:
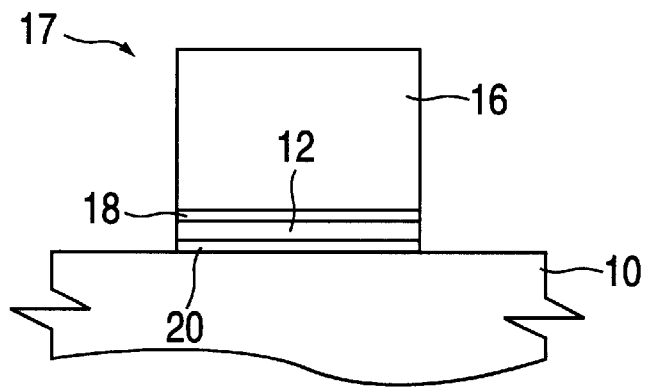
FIG. 6 depicts the structure of FIG. 4 following subsequent to gate formation.
Figure 7:
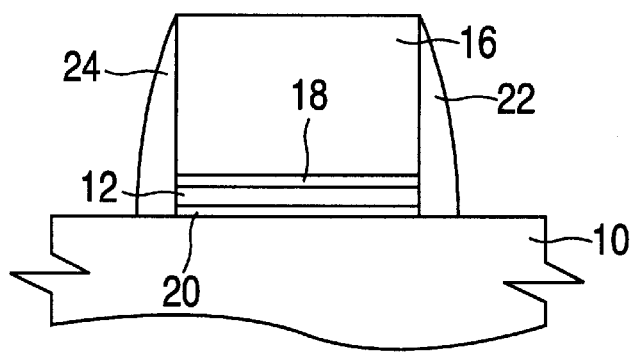
FIG. 7 depicts the structure of FIG. 6 after spacer formation.
Figure 8:
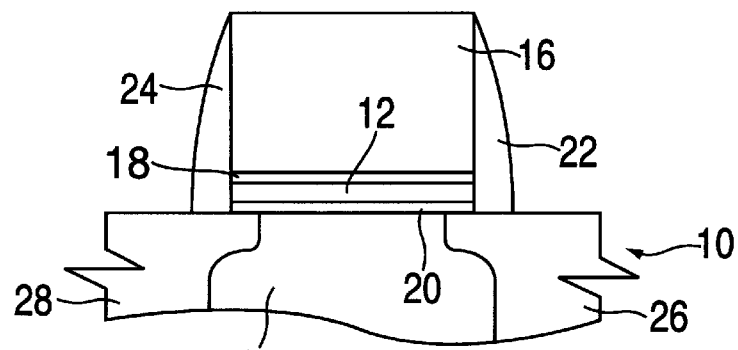
FIG. 8 depicts the structure of FIG. 7 after CMOS processing to complete the device.
Figure 9:
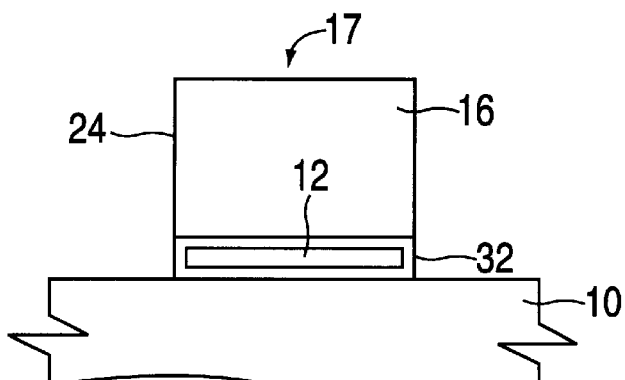
FIG. 9 depicts an alternate embodiment wherein the structure of FIG. 3 is subjected to gate formation prior to annealing the nitrogen implanted dielectric layer.
Figure 10:
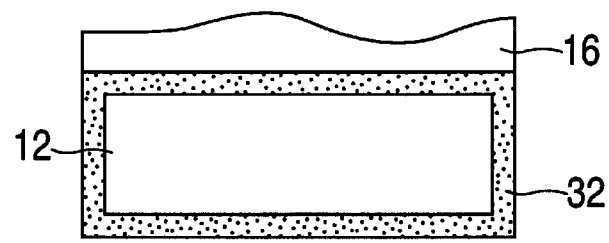
FIG. 10 shows a cross-section of the dielectric layer after annealing treatment.

Referring to the drawings, FIGS. 1–8 illustrate one embodiment of a fabrication process for forming the CMOS device shown in FIG. 8. In FIG. 1, a silicon semiconductor substrate 10 is shown having a high K dielectric layer 12 deposited thereon. This high K dielectric layer can be formed using deposition methods such as atomic layer CVD (ALCVD), rapid thermal CVD (RTCVD), plasma enhanced CVD (PECVD), physical vapor deposition (PVD), and reactive sputtering. Preferably, the dielectric layer is formed using an in-situ clean to prevent native oxide formation and using a low temperature chemical vapor deposition (CVD) process to stop $SiO_x$ formation. As will be described in more detail below, dielectric layer 12 will serve as a gate dielectric for devices formed subsequently.

Figure 2:
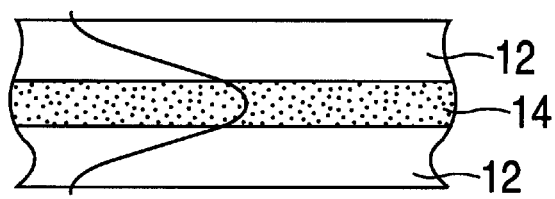
FIG. 2 shows a cross-section of a portion of the dielectric layer which has been subjected to nitrogen implantation.

Turning to FIG. 2, a processing step to the structure of FIG. 1 has been performed in which the dielectric layer 12 has been implanted with nitrogen. The bulk of the nitrogen is implanted in a layer 14 about midway into the high K dielectric layer 12, shown in detail. This nitrogen implantation may be accomplished by a variety of implant techniques. In a preferred embodiment, the peak nitrogen concentration for nitrogen ion implant is in the range of about $10^{15}$ to $10^{16}$ atoms/cm$^2$ at an implant energy of about 1 to 2 KeV. Other alternative methods of controlling the N implant profile might include using resist, $SiO_2$, or $Si_3N_4$ sacrificial blocking films. When utilizing such sacrificial blocking films, the N implant profile could be spread out more such that it might be more uniform throughout the high K dielectric layer. Additional techniques for implanting nitrogen into the dielectric layer include exposure to a $N_2$ or $NH_3$ plasma.

Figure 3:
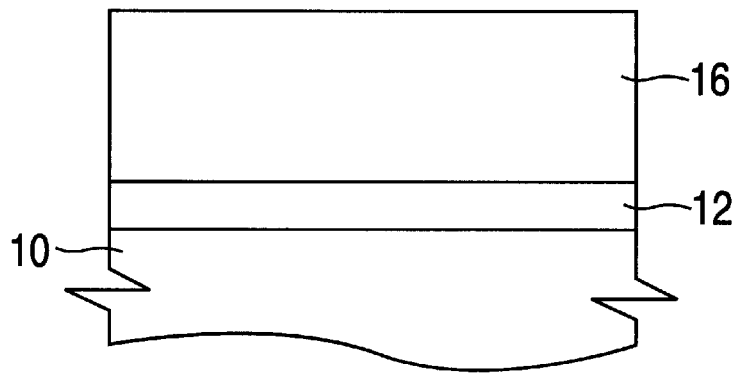
FIG. 3 depicts the structure of FIG. 1 after nitrogen implantation of the dielectric layer and formation of a polysilicon layer.
Figure 4:
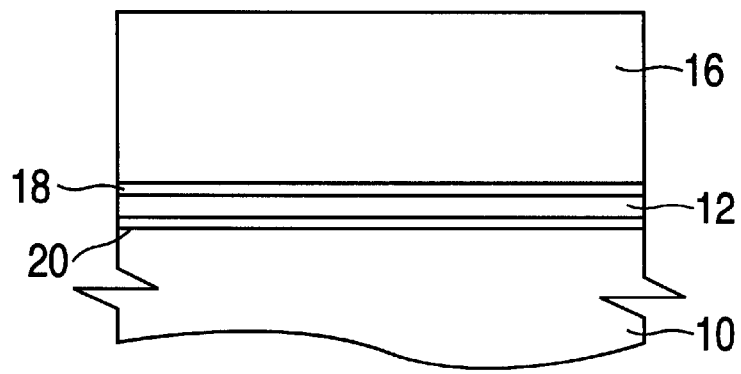
FIG. 4 depicts the structure of FIG. 3 after annealing treatment.
Figure 5:
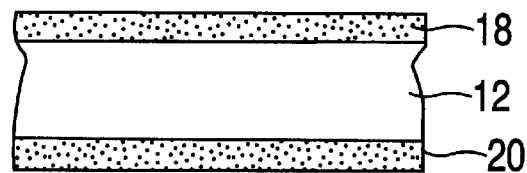
FIG. 5 shows a cross-section of the dielectric layer after annealing treatment.

FIG. 3 depicts the structure of FIG. 1 after nitrogen implantation as shown in FIG. 2 and following formation of a polysilicon gate layer 16 on top of dielectric layer 12. This polysilicon layer may be formed by conventional chemical vapor deposition techniques, typically at a pressure of less than about 2 torrs and at a temperature maintained between about 500 to 650° C.

The semiconductor substrate 10 then is raised to a temperature of approximately 900° C. to 1100° C. for a duration of about five seconds to one minute. This anneal step preferably is conducted in rapid thermal processing (RTP) equipment, although alternative equipment also may be employed. The purpose of this anneal step is to segregate the nitrogen to the lower interface between the silicon substrate and the dielectric layer and the upper interface between the dielectric layer and the polysilicon, forming nitrogen rich layers 18 and 20 of a silicon nitride-like material of about 5 Å thickness. The silicon for these silicon nitride upper and lower layers 18 and 20 come from the polysilicon and silicon of layers 16 and 10 respectively. These silicon nitride nitrogen rich layers 18 and 20 actually are expected to be mixtures of $SiN_x$, and/or $SiN_xO_y$ with the high K dielectric material and Si of the interfacing layers, as shown in more detail in FIG. 5. In the embodiment shown, in order to accomplish an EOT of about 20 Å $SiO_2$ for the gate dielectric, these 5 Å thick $SiN_x$ (K=8) layers would account for about half of the allotted 20 Å EOT budget, while, for example, the 40 Å of a high K dielectric material such as $Ta_2O_5$ (K=25) would consume the remaining half of the budget.

Referring now to FIG. 6, polysilicon layer 16 is patterned to form gate structure 17. Patterning of conductive gate structure 17 preferably is accomplished with conventional photolithography and etch techniques. Proceeding to FIG. 7, a pair of spacer structures 22 and 24 have been formed on sidewalls of conductive gate structure 17. These spacer structures can be formed, for example, by well known techniques in which a conformal oxide dielectric layer first is deposited over the substrate by a low pressure CVD process. Then, the deposited dielectric layer is removed by anisotropic dry etching leaving behind spacer structures 22 and 24 after completion of the etch process. Finally, as illustrated in FIG. 8, a first source/drain (S/D) impurity distribution region 26 and a second S/D impurity distribution region 28 are laterally displaced on either side of channel region 30, using conventional CMOS processing techniques.

Figure 11:
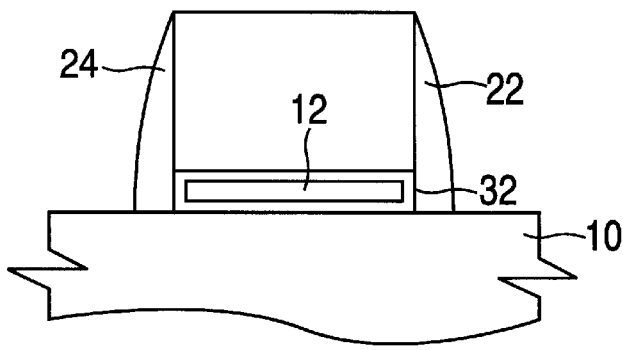
FIG. 11 depicts the structure of FIG. 9 after spacer formation.
Figure 12:
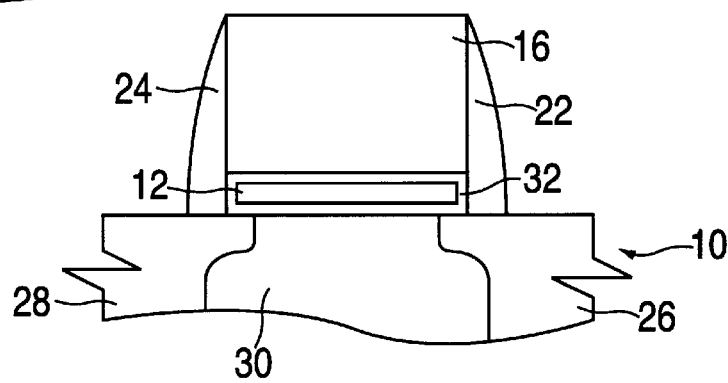
FIG. 12 depicts the structure of FIG. 11 after CMOS processing to complete the device.

FIGS. 9 through 12 illustrate a second embodiment of the present invention. Pursuant to this alternative embodiment, the anneal step to drive the nitrogen implanted in the high K dielectric layer 12 is not performed immediately subsequent to the formation of polysilicon layer 16 as described above. Instead, the gate structure 17 first is formed, in the manner described above, and then the anneal is conducted. In this manner, the resultant structure is as shown in FIG. 7, wherein the $SiN_x$ layer 32 forms at the interfaces of the dielectric layer and the polysilicon gate and substrate layers respectively, as well as the lateral sidewall edges of the dielectric layer 12. This $SiN_x$ structure 32 is shown in detail in FIG. 10. The structure then is processed as previously described to form spaces, as shown in FIG. 11, and finally the completed CMOS device structure of FIG. 12. This embodiment is particularly advantageous for a device design wherein the $SiN_x$ or the sidewall lateral edges would be useful as "replacement" for spacers, since the thin layer of $SiN_x$ on the sidewall effectively acts as a very narrow spacer.

While the invention has been described with reference to specific embodiments thereof, it is intended that all matter contained in the above description or shown in the accompanying drawings be interpreted as illustrative and not limiting in nature. Various modifications of the disclosed embodiments, as well as other embodiments of the invention, will be apparent to those skilled in the art upon reference to this description, or may be made without departing from the spirit and scope of the invention defined in the appended claims.

We claim:

1. A method for forming a semiconductor device comprising:

forming a dielectric layer comprising a high dielectric constant material on an area of a silicon substrate;

implanting nitrogen atoms into said dielectric layer;

forming a conductive layer of polysilicon over said dielectric layer;

annealing the dielectric layer to drive the nitrogen atoms to form a gate dielectric of a dielectric layer having silicon nitride layers at the interfaces of the dielectric layer with the silicon substrate and the polysilicon layers; and, forming a gate structure in said polysilicon layer and source/drain regions in said silicon substrate, said source/drain regions aligned with said gate structure.

2. The method of claim 1 wherein the dielectric layer comprises a high dielectric constant material comprising a metallic oxide or metallic silicate material.

3. The method of claim 2 wherein the dielectric layer comprises material selected from the group consisting of Ta, Al, Ti, Zr, Y, La, and Hf oxides or silicates, combinations thereof, and the like.

4. The method of claim 2 wherein the dielectric layer comprises Al or Zr oxides or silicates.

5. The method of claim 1 wherein the gate dielectric has an equivalent oxide thickness of less than about 20 Å $SiO_2$.

6. The method of claim 5 wherein the silicon nitride layers comprise a mixture of $SiN_x$, $SiN_xO_y$, Si, and dielectric, and have a thickness of about 5 Å to 10 Å.

7. The method of claim 2 comprising forming a gate structure prior to annealing the metallic oxide layer.

8. A method of forming a semiconductor device comprising:

forming a dielectric layer on an area of a silicon substrate;

implanting nitrogen atoms into said metallic oxide layer;

forming a conductive layer of polysilicon over said dielectric layer;

annealing the dielectric layer to drive the nitrogen atoms to form a gate dielectric of a dielectric layer having silicon nitride layers having a thickness of about 5 Å to 10 Å at interfaces of the dielectric layer and the silicon substrate and the polysilicon layers, said gate dielectric having an equivalent oxide thickness of less than about 20 Å $SiO_2$; and, forming a gate structure in said polysilicon layer and source/drain regions in said silicon substrate, said source/drain regions aligned with said gate structure.

9. The method of claim 8 wherein the dielectric layer comprises a high dielectric constant material comprising a metallic oxide or metallic silicate material.

10. The method of claim 9 wherein the metallic oxide layer comprises material selected from the group consisting of Ta, Al, Ti, Zr, Y, La, and Hf oxides or silicates, combinations thereof, and the like.

11. The method of claim 9 wherein the dielectric layer comprises Al or Zr oxides or silicates.

12. The method of claim 9 comprising forming a gate structure prior to annealing the dielectric layer.

13. A semiconductor device comprising:

a silicon substrate having source/drain regions laterally displaced on either side of a channel region;

a gate dielectric comprising a dielectric material having an upper diffusion barrier layer and a lower diffusion barrier layer, said gate dielectric in alignment with and on top of said channel region, and a polysilicon gate aligned with and on top of said gate dielectric.

14. The semiconductor device of claim 13 wherein the dielectric layer comprises a high dielectric constant material.

15. The semiconductor device of claim 14 wherein the dielectric layer comprises material selected from the group consisting of $Ta_2O_5$, $Al_2O_3$, $TiO_2$, $ZrO_2$, $Y_2O_3$, $HfO_2$, $La_2O_3$; Ta, Al, Zr, Y, La, and Hf silicates; combinations thereof, and the like.

16. The semiconductor device of claim 14 wherein the dielectric layer comprises Al or Zr oxides or silicates.

17. The semiconductor device of claim 13 wherein the gate dielectric has an EOT of less than about 20 Å $SiO_2$.

18. The semiconductor device of claim 13 wherein said upper diffusion barrier layer and said lower diffusion barrier layer comprises silicon nitride.

19. The semiconductor device of claim 18 wherein the silicon nitride layers have a thickness of about 5 Å to 10 Å.

* * * * *